United States Patent [19]

Yoshida

[11] Patent Number: 5,537,058
[45] Date of Patent: Jul. 16, 1996

[54] SEMICONDUCTOR DEVICE HAVING HIGH SPEED INPUT CIRCUIT

[75] Inventor: Souichirou Yoshida, Kanagawa, Japan

[73] Assignee: NEC Corporation, Tokyo, Japan

[21] Appl. No.: 493,305

[22] Filed: Jun. 21, 1995

[30] Foreign Application Priority Data

Jun. 21, 1994 [JP] Japan ................................ 6-138841

[51] Int. Cl.$^6$ .................................................. H03K 17/16
[52] U.S. Cl. .............................. 326/24; 326/21; 326/103
[58] Field of Search ............................ 326/21–24, 71, 326/102–103

[56] References Cited

U.S. PATENT DOCUMENTS

| 488,978 | 11/1989 | Ohshima et al. ........................ 326/24 |
| 4,563,595 | 1/1986 | Bose ...................................... 326/22 X |
| 5,274,280 | 12/1993 | Ito et al. .............................. 326/21 X |
| 5,319,260 | 6/1994 | Wanlass ................................ 326/21 X |

FOREIGN PATENT DOCUMENTS

| 363010913A | 1/1988 | Japan .................................... 326/24 |
| 3-183159 | 8/1991 | Japan . |

*Primary Examiner*—David R. Hudspeth
*Attorney, Agent, or Firm*—Sughrue, Mion, Zinn, Macpeak & Seas

[57] ABSTRACT

In a semiconductor device, an input voltage is applied to a gate of a first MIS transistor of a first conductivity type and gates of second and third MIS transistors of a second conductivity type. The first MIS transistor is connected between a first power supply pad and an output node, the second MIS transistor is connected between the output node and a second power supply pad, and the third MIS transistor is connected between the output node and a third power supply pad.

8 Claims, 12 Drawing Sheets

- ⌐ ¬  IMPURITY DIFFUSION REGION
- ▭  POLYCRYSTALLINE SILICON LAYER
- ▨  ALUMINUM LAYER
- o  CONTACT

[ ] IMPURITY DIFFUSION REGION

□ POLYCRYSTALLINE SILICON LAYER

▨ 1st ALUMINUM LAYER

▧ 2nd ALUMINUM LAYER o  CONTACT

SEMICONDUCTOR DEVICE HAVING HIGH SPEED INPUT CIRCUIT

BACKGROUND OF THE INVENTION

1. Field of the invention

The present invention relates to a semiconductor device, and more particularly, to the improvement of an input circuit thereof.

2. Description of the Related Art

In a semiconductor device, an input circuit is provided for inputting an input signal of a TTL level and converting it into a signal of a MOS level.

A first prior art input circuit receives a ground voltage from a ground pad which is individually provided from ground pads for functional circuits such as address decoders, sense amplifiers, and data output buffers (See: JP-A-HEI3-183159). This will be explained later in detail.

In the first prior art input circuit, however, since the number of pads is increased, the integration of the device is reduced.

In order to enhance the integration of the device, a ground pad is provided commonly for the input circuit and a functional circuit, to reduce the number of pads. This will be explained later in detail.

In the second prior input circuit, however, since noise due to the operation of the functional circuit is applied via the ground pad to the input circuit, the access speed of the input circuit is decreased, and accordingly, the access speed of the device is decreased.

SUMMARY OF THE INVENTION

It is, therefore, an object of the present invention to provide a semiconductor device having a high speed input circuit without reducing the integration thereof.

According to the present invention, in a semiconductor device, an input voltage is applied to a gate of a first MIS transistor of a first conductivity type and gates of second and third MIS transistors of a second conductivity type. The first MIS transistor is connected between a first power supply pad and an output node, the second MIS transistor is connected between the output node and a second power supply pad, and the third MIS transistor is connected between the output node and a third power supply pad.

Thus, since noise applied to the second MIS transistor may not occur simultaneously with noise applied to the third MIS transistor, the noise applied to the input circuit is substantially reduced.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, prior art semiconductor devices will be explained with reference to FIGS. 1, 2, 3, 4, 5A, 5B, 6A and 6B.

Figure 1:
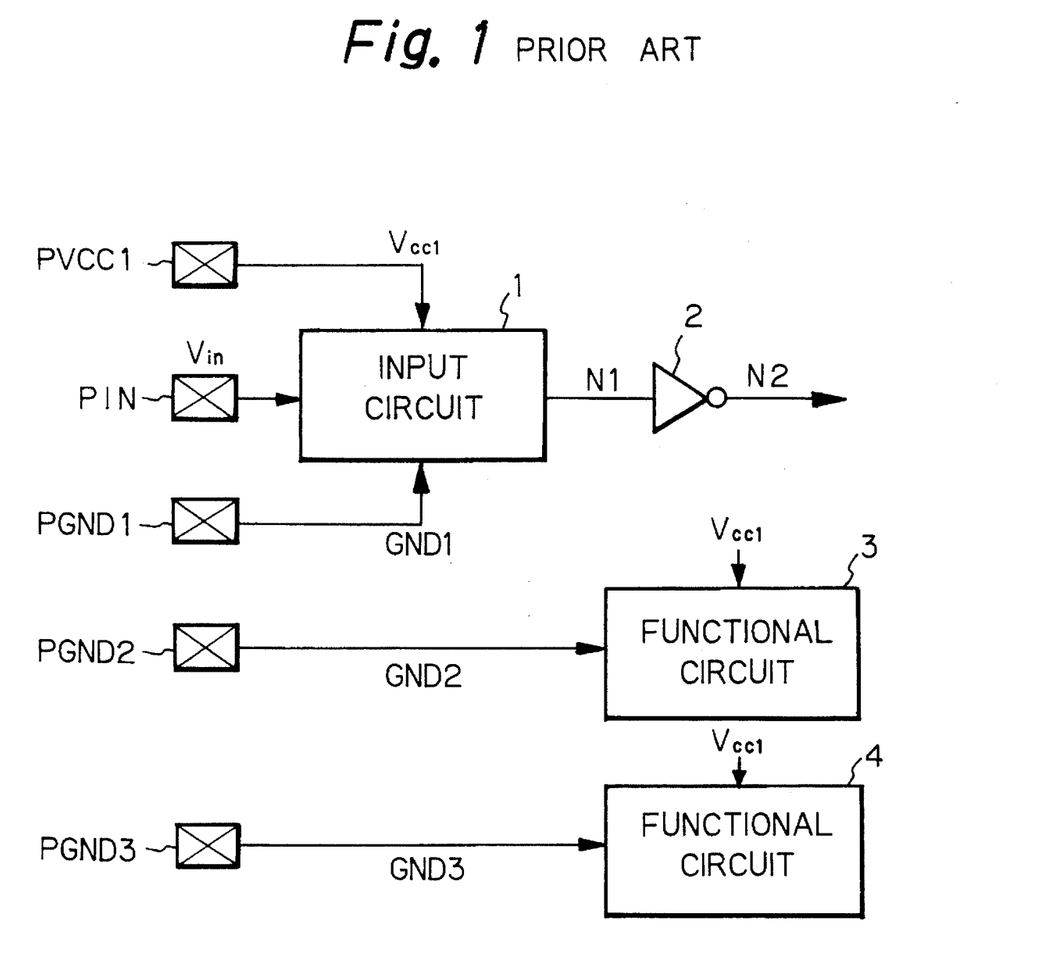
FIG. 1 is a block circuit diagram illustrating a first prior art semiconductor device.

In FIG. 1, which illustrates a first prior art semiconductor device such as a dynamic random access memory (DRAM) (see: JP-A-HEI3-183159), an input circuit 1 receives an input voltage $V_{in}$ of a TTL level from an input pad PIN and generates an output signal at a node N1. The input circuit 1 is powered by a high voltage $V_{cc}^1$ applied to a power supply pad PVCC1 and a low voltage GND1 applied to a ground pad PGND1. The output signal at the node N1 is wave-shaped by an inverter 2 which is also powered by the voltages $V_{cc}^1$ and GND1, and a wave-shaped signal is obtained at a node N2.

Also, a factional circuit 3 such as a sense amplifier is powered by the voltage $V_{cc}^1$ and a low voltage GND2 applied to a ground pad PGND2. Further, a functional circuit 4 such as a data output buffer is powered by the voltage $V_{cc}^1$ and a low voltage GND3 applied to a ground pad PGND 3.

In the semiconductor device of FIG. 1, however, as stated above, since the number of pads is large, the integration of the device is reduced.

Figure 2:
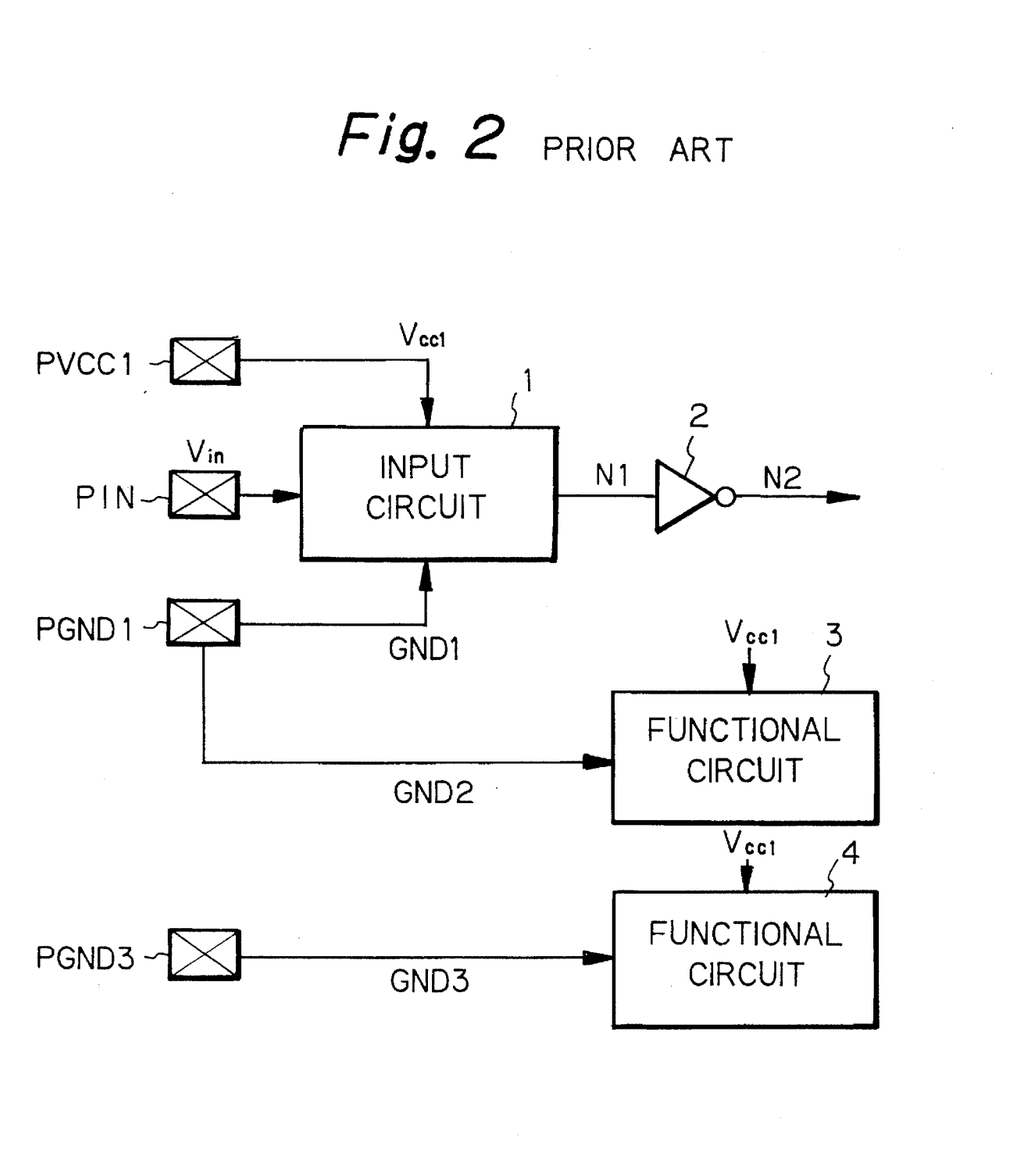
FIG. 2 is a block circuit diagram illustrating a second prior art semiconductor device.

In FIG. 2, which illustrates a second prior art semiconductor device, the functional circuit 3 is connected to the power supply pad PGND1, and accordingly, the ground pad PGND2 of FIG. 1 is deleted. Since the number of pads is reduced, the integration of the device is enhanced.

Figure 3:
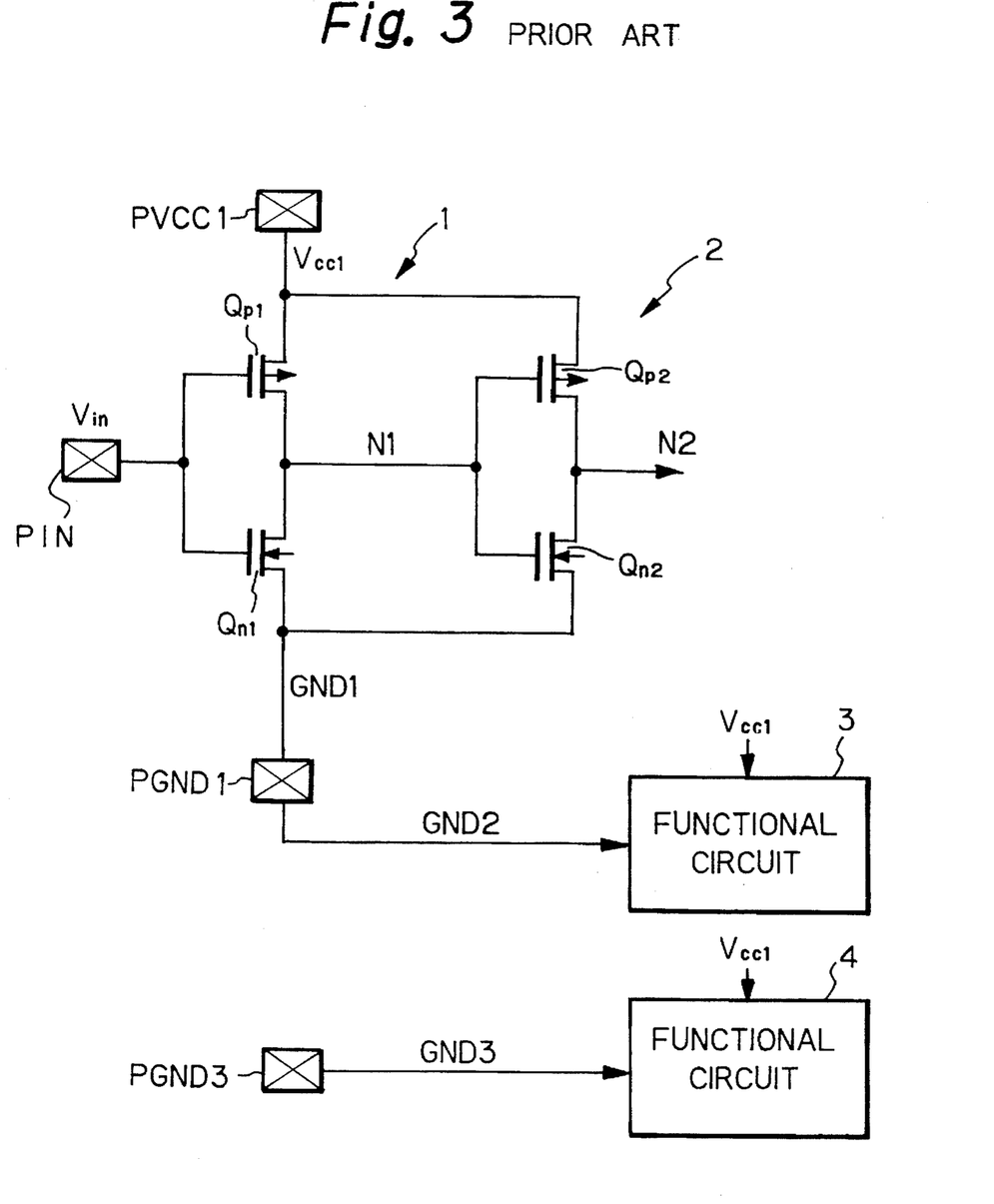
FIG. 3 is a detailed circuit diagram of the device of FIG. 2.

In FIG. 3, which is a detailed circuit diagram of the device of FIG. 2, the input circuit 1 is formed by a P-channel MOS (broadly, MIS) transistor $Q_p^1$ connected between the power supply pad PVCC1 and the node N1 and an N-channel MOS transistor $Q_n^1$ connected between the node N1 and the ground pad PGND1. The input voltage $V_{in}$ is applied to gates of the transistors $Q_p^1$ and $Q_n^1$. Also, the inverter 2 is formed by a P-channel MOS transistor $Q_p^2$ connected between the power supply pad PVCC1 and the node N2 and an N-channel MOS transistor $Q_n^2$ connected between the node N2 and the ground pad PGND2. The voltage at the mode N1 is applied to gates of the transistors $Q_p^2$ and $Q_n^2$.

Figure 4:
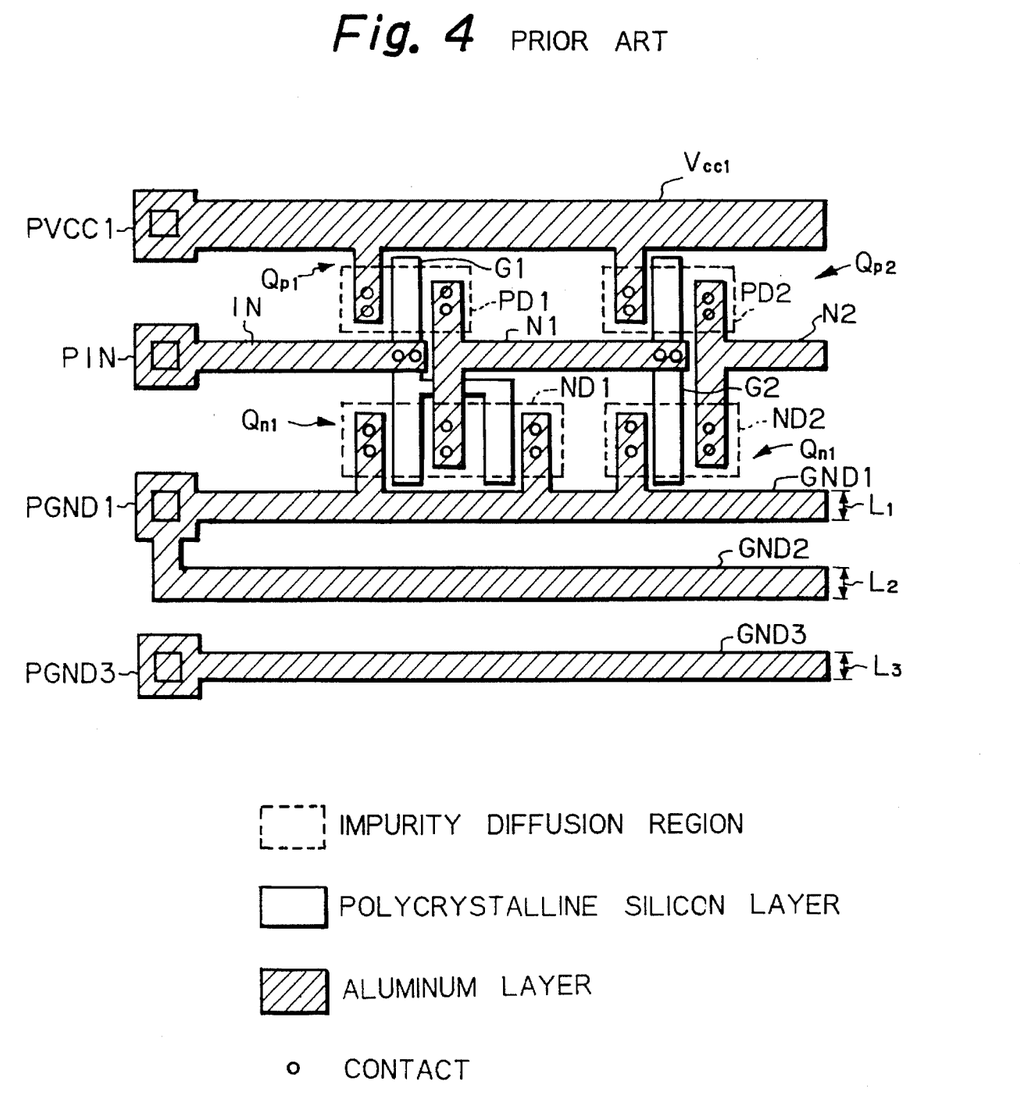
FIG. 4 is a plan view illustrating the device of FIG. 3.

Further, referring to FIG. 4, which is a plan view of the device of FIG. 3, reference numerals PD1 and PD2 designate P-type impurity diffusion regions, and ND1 and ND2 designate N-type impurity diffusion regions. Also, reference numerals G1 and G2 designate polycrystalline silicon layers. Further, references $V_{cc}^1$, IN, N1, N2, GND1, GND2 and GND3 designate first aluminum layers.

In FIG. 4, the transistor $Q_p^1$ is formed by the P-type impurity diffusion region PD1 which are divided into a source region connected via contacts to the aluminum layer $V_{cc}^1$ and a drain region connected via contacts to the aluminum layer N1, and the polycrystalline silicon layer G1 serving as a gate electrode connected via contacts to the aluminum layer IN. Also, the transistor $Q_n^1$ is formed by the N-type impurity diffusion region ND1 which is divided into two source regions connected via contacts to the aluminum layer GND1 and a drain region connected via contacts to the aluminum layer N1, and the polycrystalline silicon layer G1 serving as a gate electrode connected via contacts to the aluminum layer IN.

Also, in FIG. 4, the transistor $Q_p^2$ is formed by the P-type impurity diffusion region PD2 which is divided into a source region connected via contacts to the aluminum layer $V_{cc}^1$ and a drain region connected via contacts to the aluminum layer N2, and the polycrystalline silicon layer G2 serving as a gate electrode connected via contacts to the aluminum layer N1. Also, the transistor $Q_n^2$ is formed by the N-type impurity diffusion region ND2 which is divided into a source region connected via contacts to the aluminum layer GND1 and a drain region connected via contacts to the aluminum layer N2, and the polycrystalline silicon layer G2 serving as a gate electrode connected via contacts to the aluminum layer N2.

Further, the aluminum layers $V_{cc}^1$ and GND1 extend and reach the functional circuit 3 (see FIG. 3), and the aluminum layers $V_{cc}^1$ and GND2 extend and reach the functional circuit 4 (see FIG. 3).

The operation of the device of FIG. 3 will be explained next with reference to FIGS. 5A and 5B where the functional circuit 3 is not operated.

Figure 5A:
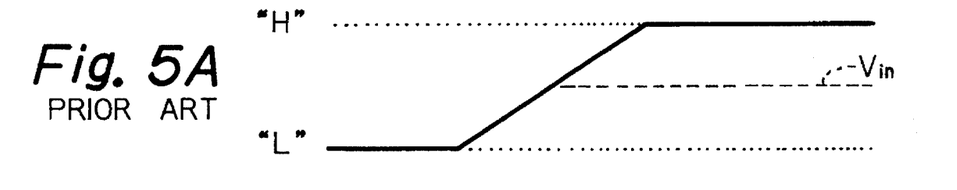
FIG. 5A and 5B are timing diagrams for explaining the operation of the device of FIG. 3.
Figure 5B:
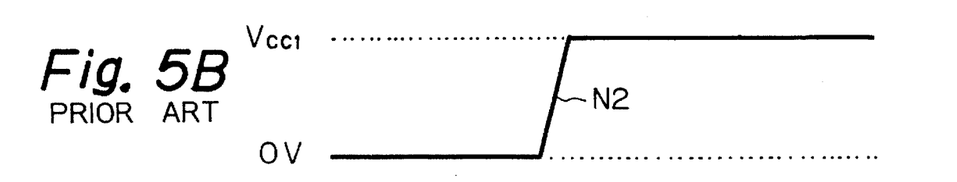

As shown in FIGS. 5A and 5B, the input voltage $V_{in}$ is changed from low ("L") to high ("H"). In this case, the transistor $Q_p^1$ is operated in a saturation state, and therefore, a soure-to-drain current $I_p$ flowing through the transistor $Q_p^1$ is $$I_p = K_p(V_{cc} - V_{in} - |V_{thp}|)2 \quad (1)$$

where $K_p$ is a constant; and $V_{thp}$ is a threshold voltage of the transistor $Q_p^1$.

Also, the transistor $Q_n^1$ is operated in a saturation state, and therefore, a drain-to-source current I flowing through the transistor $Q^1$ is $$I_n = K_n(V_{in} - V_{thn})2 \quad (2)$$

where $K_n$ is a constant; and $V_{thn}$ is a threshold voltage of the transistor $Q_n^1$.

Since the current flowing through the transistor $Q_p^1$ is equal to the current flowing through the transistor $Q_n^1$, the following relationship is satisfied:

$$I_p = I_n \quad (3)$$

The operation of the device of FIG. 3 will be explained with reference to FIGS. 6A and 6B where the functional circuit 3 is operated.

Figure 6A:
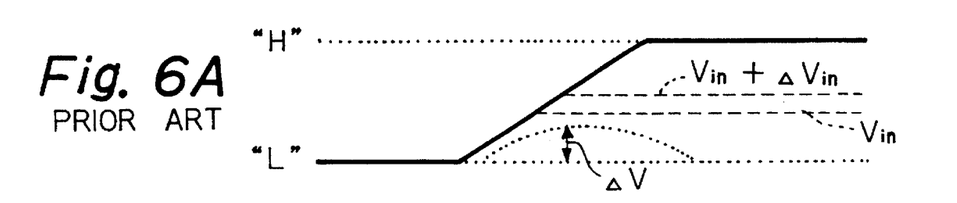
FIGS. 6A and 6B are timing diagrams for explaining the operation of the device of FIG. 3.
Figure 6B:
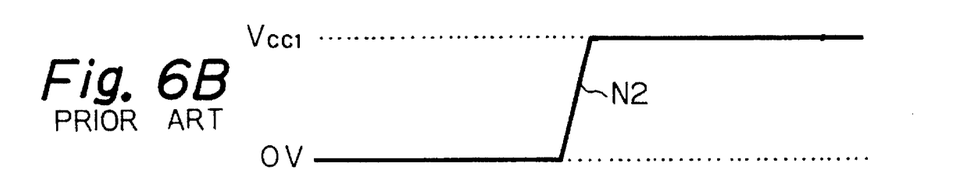

As shown in FIGS. 6A and 6B, the input voltage $V_{in}$ is changed from low ("L") to high ("H"). In this case, however, since the voltage GND1 is raised by $\Delta V$ due to the noise of the functional circuit 3, the voltage at the input pad PIN becomes $V_{in+\Delta Vin}$. Therefore, a soure-to-drain current $I_p$ flowing through the transistor $Q_p^1$ is $$I_p' = K_p(V_{cc_1} - V_{in} - \Delta V_{in} - |V_{thp}|)2 \quad (4)$$

Contrary to the above, the drain-to-source voltage of the transistor $Q_n^1$ is reduced by $\Delta V$, and therefore, the transistor $Q_n^1$ is operated in a non-saturation state. As a result, a drain-to-source current $I_n'$ flowing through the transistor $Q_n$ is $$I_n' = K_n(V_{in} + \Delta V_{in} - \Delta V - V_{thn}) - K_n(V_{N_1} - \Delta V)^2/2 \quad (5)$$

s where $V_N^1$ is a voltage at the node N1 by which the transistor $Q_p^2$ of the inverter 2 is turned ON.

Also, since the current flowing through the transistor $Q_p^1$ is equal to the current flowing through the transistor $Q_n^1$, the following relationship is satisfied:

$$I_p' = I_n' \quad (6)$$

From the equations (3) and (6), $$I_p/I_p' = I_n/I_n' \quad (7)$$

For example, if $V_{cc}^1 = 5V$, $V_{in} = 1.7V$, $V_{thp} = -0.8V$, $V_{thn} = 0.7V$, $V_n^1 = 1.5V$, and $\Delta V = 1.0V$, then $\Delta V_{in} = 0.98V$.

Thus, in the device of FIG. 3, when the voltage GND1 is raised due to the noise by the operation of the functional circuit 3, so that the input voltage $V_{in\,1}$ is also affected by the noise of the operation of the functional circuit 3, a transition of the voltage at the node N2 from a low level to a high level is delayed. Therefore, the access speed of the input circuit 1 is reduced, and accordingly, the access speed of the device is reduced.

Figure 7:
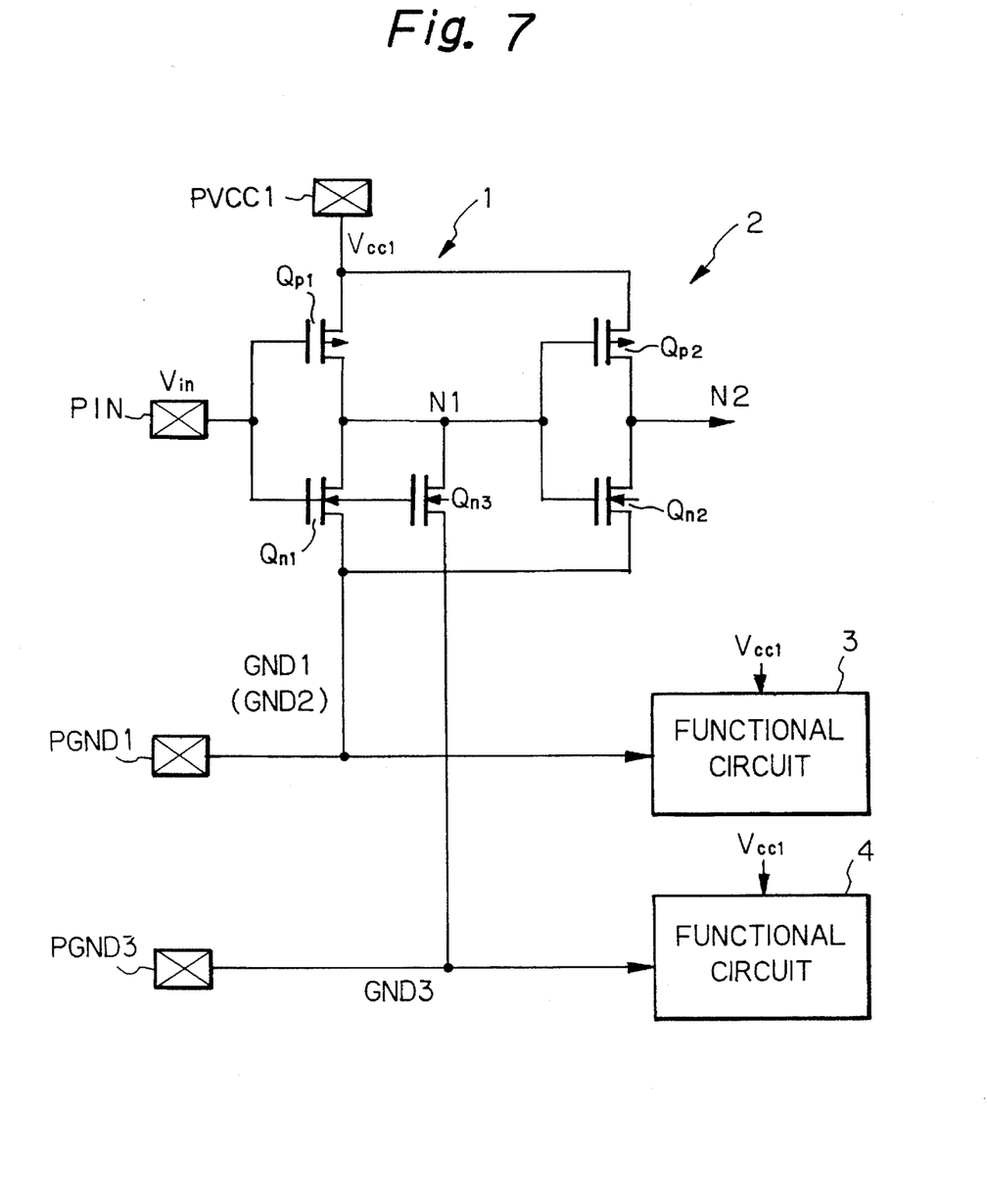
FIG. 7 is a circuit diagram illustrating a first embodiment of the semiconductor device according to the present invention.
Figure 8:
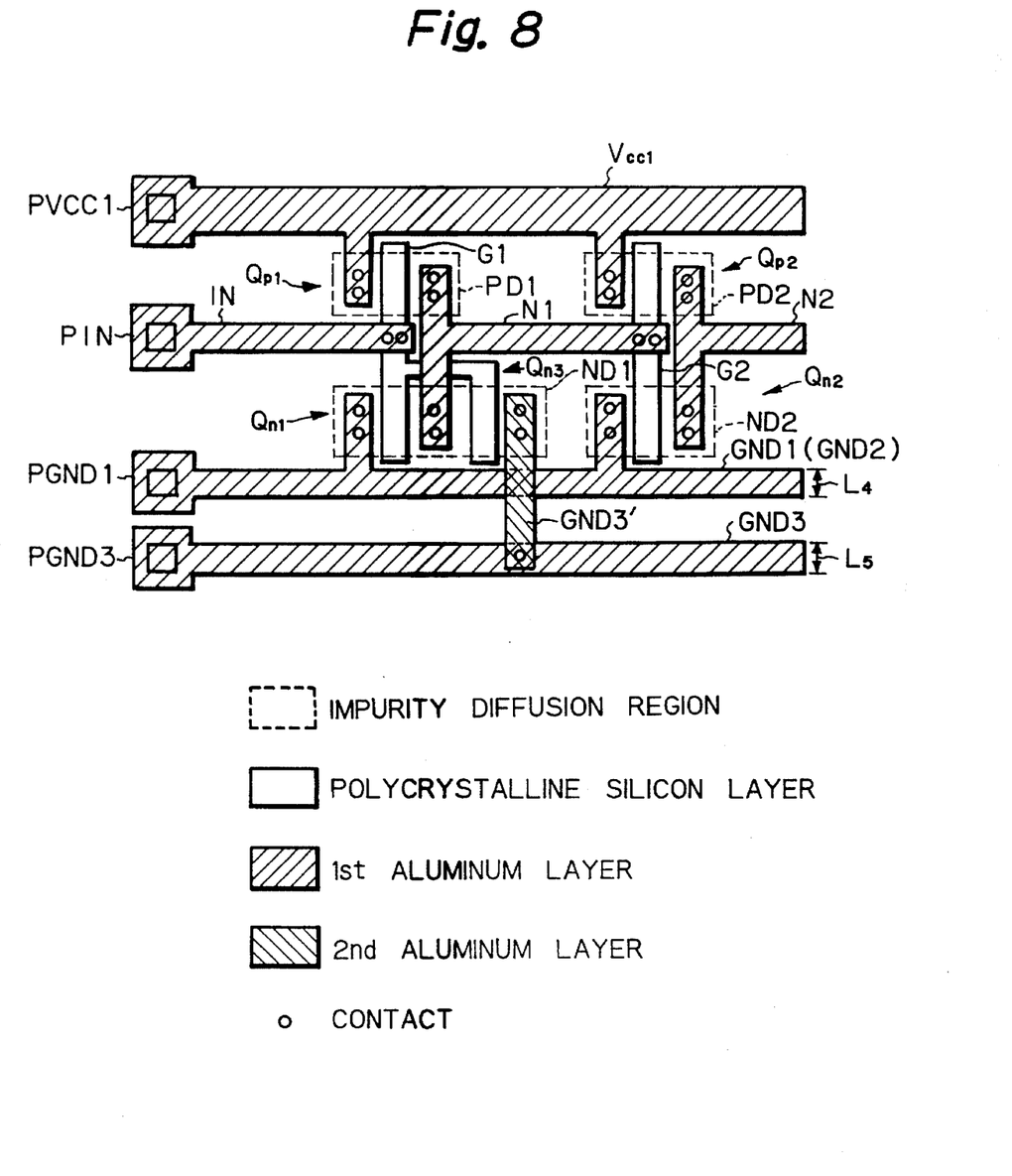
FIG. 8 is a plan view illustrating the device of FIG. 7.

In FIG. 7, which illustrates a first embodiment of the present invention, an N-channel MOS transistor $Q_n^3$ is added to the elements of FIG. 3. The transistor $Q_n^3$ is connected between the node N1 and the ground pad PGND3 (i.e., the functional circuit 4). A gate of the transistor $Q_n^3$ is also controlled by the input signal Vin. that is, as illustrated in FIG. 8, a second aluminum layer GND3' is provided and is connected via contacts to one source region of the N-type impurity region ND1 and via contacts to the first aluminum layer GND3. Thus, if $L_4 = L_1 + L_2/2$ and $L_5 L_2/2 + L_3$, where $L_1$, $L_2$ and $L_3$ are widths of the layers GND1, GNU)2, and GND3, respectively, of FIG. 4, and $L_4$ and $L_5$ are widths of the layers GND1 (GND2) and GND3, respectively, of FIG. 8, the device of FIG. 7 is not deteriorated in integration as compared with that of FIG. 3.

The operation of the device of FIG. 7 will be explained next with reference to FIGS. 9A and 9B where the functional circuits 3 and 4 are not operated.

Figure 9A:
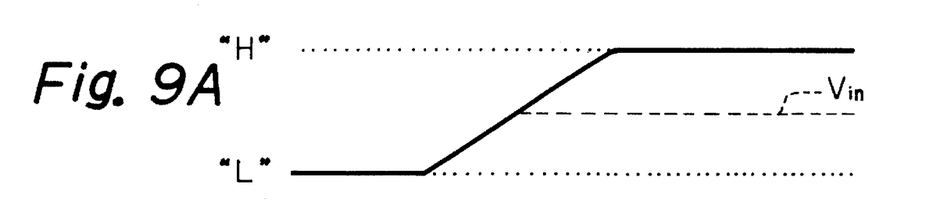
FIGS. 9A and 9B are timing diagrams for explaining the operation of the device of FIG. 7.
Figure 9B:
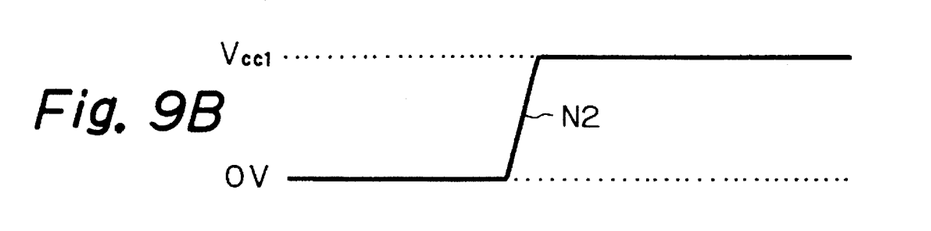

As shown in FIGS. 9A and 9B, the input voltage $V_{in}$ is changed from low ("L") to high ("H"). In this case, the transistor $Q_p^1$ is operated in a saturation state, and therefore, a soure-to-drain current $I_p$ flowing through the transistor $Q_p^1$ is $$I_p = K_p(V_{cc} - |V_{thp}|)2 \quad (8)$$

where $K_p$ is a constant; and
$V_{thp}$ is a threshold voltage of the transistor $Q_p^1$.

Also, the transistors $Q_n^1$ and $Q_n^3$ are operated in a saturation state, and therefore, a drain-to-source current $I_{n1}$ flowing through the transistor $Q_n^1$ is $$I_{n_1} = K_n'(V_{in} - V_{thn_1})2 \quad (9)$$

where $K_n'$ is a constant; and $V_{thn}^1$ is a threshold voltage of the transistor $Q_n^1$. Also, a drain-to-source current $I_n^2$ flowing through the transistor $Q_n^2$ is $$I_{n_2}=K_n'(V_{in}-V_{thn_2})2 \qquad (10)$$

where $V_{thn}^2$ is a threshold voltage of the transistor $Q_n^2$.

since the current flowing through the transistor $Q_p^1$ is equal to the current flowing through the transistors $Q_n^1$ and $Q_n^2$, the following relationship is satisfied:

$$I_p=I_{n_1}+I_{n_2} \qquad (11)$$

The operation of the device of FIG. 7 will be explained next with reference to FIGS. 10A and 10B where the functional circuit 3 is operated and the functional circuit 4 is not operated. Note that, if the functional circuit 3 is a sense amplifier and the functional circuit 4 is a data output buffer, the functional circuits 3 and 4 are not simultaneously operated. In other words, when one of the functional circuits 3 and 4 is operated, the other is not operated.

Figure 10A:
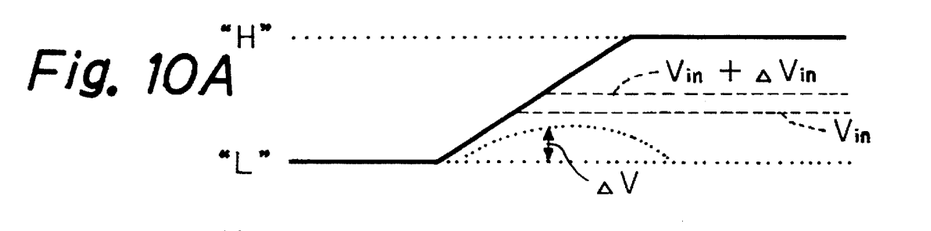
FIGS. 10A and 10B are timing diagrams for explaining the operation of the device of FIG. 7.
Figure 10B:
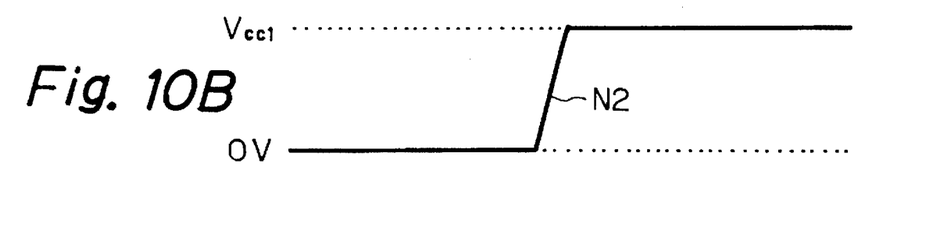

As shown in FIGS. 10A and 10B, the input voltage $V_{in}$ is changed from low ("L") to high ("H"). In this case, however, since the voltage GND1 is raised by $\Delta V$ due to the noise of the functional circuit 3, the voltage at the input pad PIN becomes $V_{in}+\Delta V_{in}$. Therefore, a soure-to-drain current $I_p'$ flowing through the transistor $Q_p^1$ is $$I_p'=K_p(V_{cc_1}-V_{in}-\Delta V_{in}-|V_{thp}|)2 \qquad (12)$$

Contrary to the above, although the drain-to-source voltage of the transistor $Q_n^1$ is reduced by $\Delta V$, the transistor $Q_n^1$ is still operated in a saturation state. As a result, a drain-to-source current $I_n^{1'}$ flowing through the transistor $Q_n^1$ is $$I_{n_1}'=K_n'(V_{in}+\Delta V_{in}-\Delta V-V_{thn_1})2 \qquad (13)$$

Also, the transistor $Q_n^2$ is operated under a saturation state, and therefore, a drain-to-source current $I_n^{2'}$ flowing through the transistor $Q_n^2$ is $$I_{n_2}'=K_n'(V_{in}+\Delta V_{in}-V-V_{thn_2})2 \qquad (14)$$

Also, since the current flowing through the transistor $Q_p^1$ is equal to the current flowing through the transistors $Q_n^1$ and $Q_n^2$, the following relationship is satisfied;

$$I_p'=I_{n_1}'+I_{n_2}' \qquad (15)$$

From the equations (11) and (15), $$I_p/I_p'=(I_{n_1}+I_{n_2})/(I_{n_1}'+I_{n_2}') \qquad (16)$$

For example, if $V_{cc}^1$=5V, $V_{in}$=1.7V, $V_{thp}$=–0.8V, $V_{thn}$=$V_{thn}^2$= 0.7V, $V_N$1.5V, and $\Delta V$ 32 1.0V, then $\Delta V_{in}$=0.25V.

Thus, the increase $\Delta V_{in}$ of the input voltage $V_{in}$ is reduced by more than 25% as compared with the prior art device of FIG. 3. As a result, a transition of the voltage at the node N2 from a low level to a high level is not delayed. Therefore, the access speed of the input circuit 1 is not so decreased, and accordingly, the access speed of the device is not so decreased.

Similarly, in the device of FIG. 3, when the voltage $V_{cc}^1$ is lowered due to the noise by the operation of the functional circuit 3, so that the input voltage $V_{in}$ is also affected by the noise of the operation of the functional circuit 3, a transition of the voltage at the node N2 from a high level to a low level is delayed. Therefore, the access speed of the input circuit 1 is reduced, and accordingly, the access speed of the device is reduced. In order to suppress the reduction of the input voltage $V_{in}$, a second embodiment of the present invention is illustrated in FIG. 11.

Figure 11:
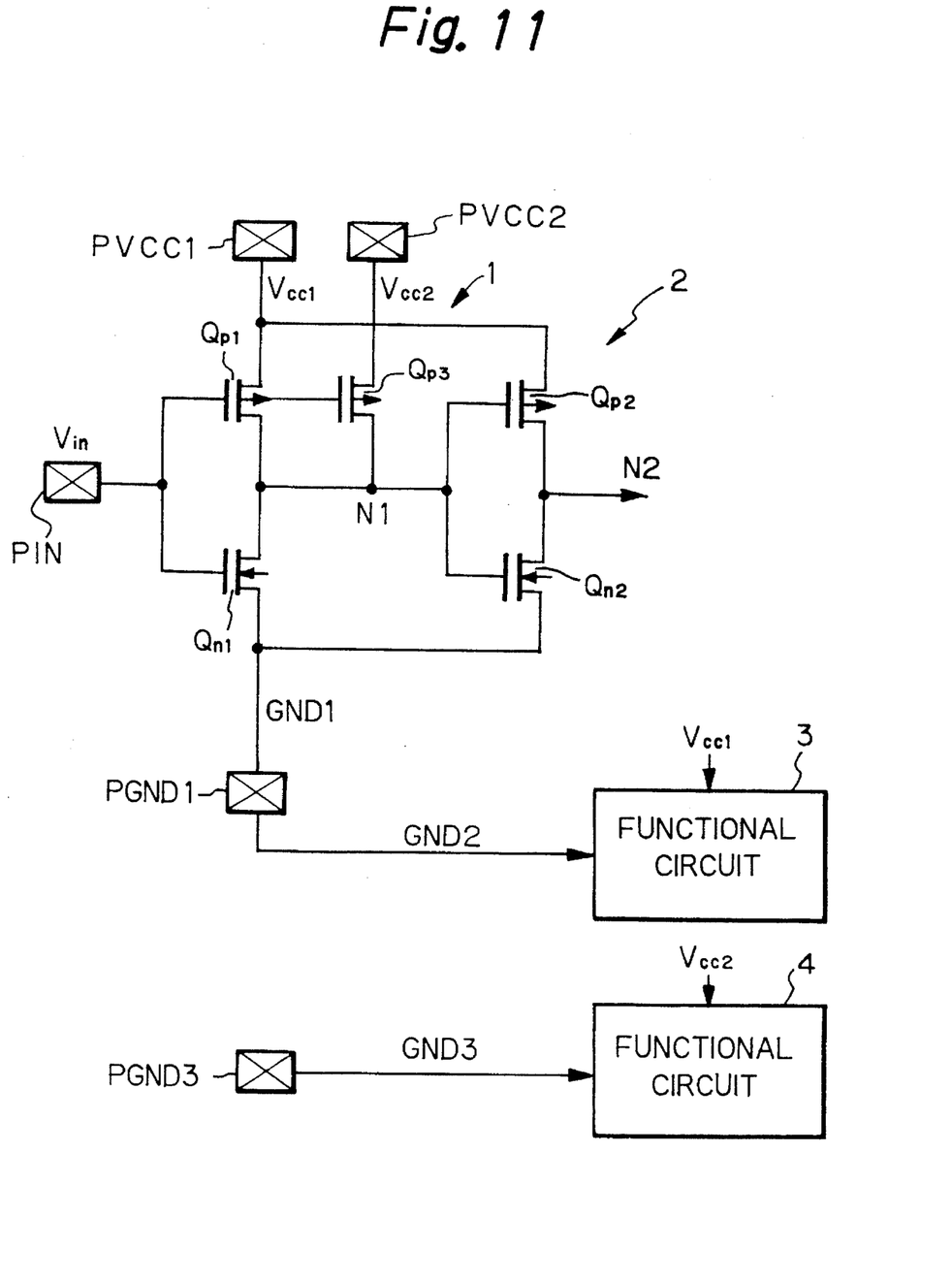
FIG. 11 is a circuit diagram illustrating a second embodiment of the semiconductor device according to the present invention.
Figure 12:
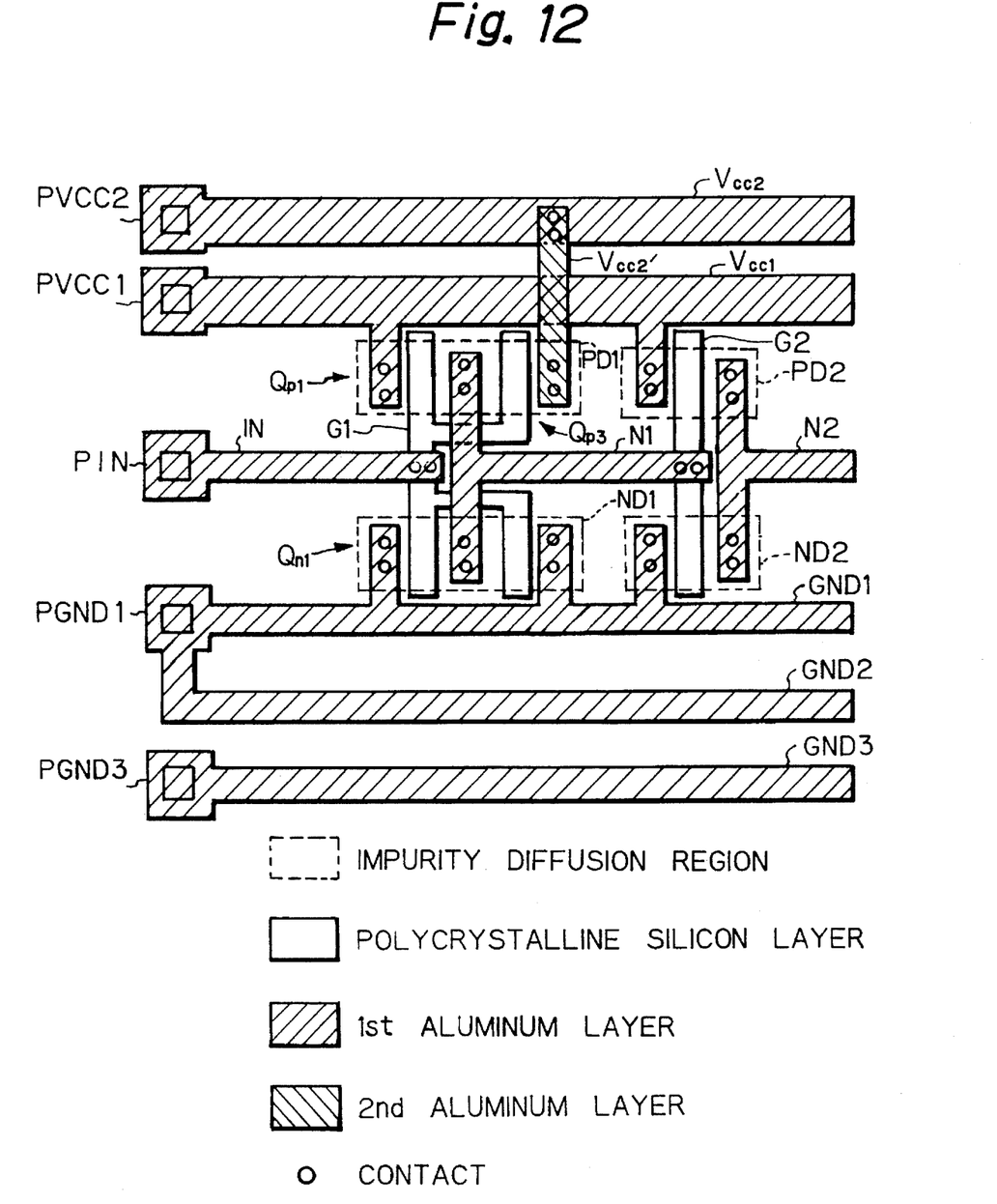
FIG. 12 is a plan view illustrating the device of FIG. 11.

In FIG. 11, a power supply pad PVCC2, a power supply layer $V_{cc}^2$ connected to the power supply pad PVCC2, and a P-channel MOS transistor $Q_p^3$ is added to the elements of FIG. 3. Note that the power supply layer $C_{cc}^2$ is made of one of the first aluminum layers. The transistor $Q_p^3$ is connected between the node N1 and another power supply pad PVCC2 (i.e., the functional circuit 4). A gate of the transistor $Q_p^3$ is also controlled by the input signal $V_{in}$. That is, as illustrated in FIG. 12, a second aluminum layer VCC' is provided and is connected via contacts to another drain region of the P-type impurity region PD1 and via contacts to first aluminum layer $C_{cc}^2$.

Similarly, in the second embodiment, the decrease $\Delta V_{in}$ of the input voltage $V_{in}$ is reduced as compared with the prior art device of FIG. 3. As a result, a transition of the voltage at the node N2 from a high level to a low level is not delayed. Therefore, the access speed of the input circuit 1 is not so decreased, and accordingly, the access speed of the device is not so decreased.

Figure 13:
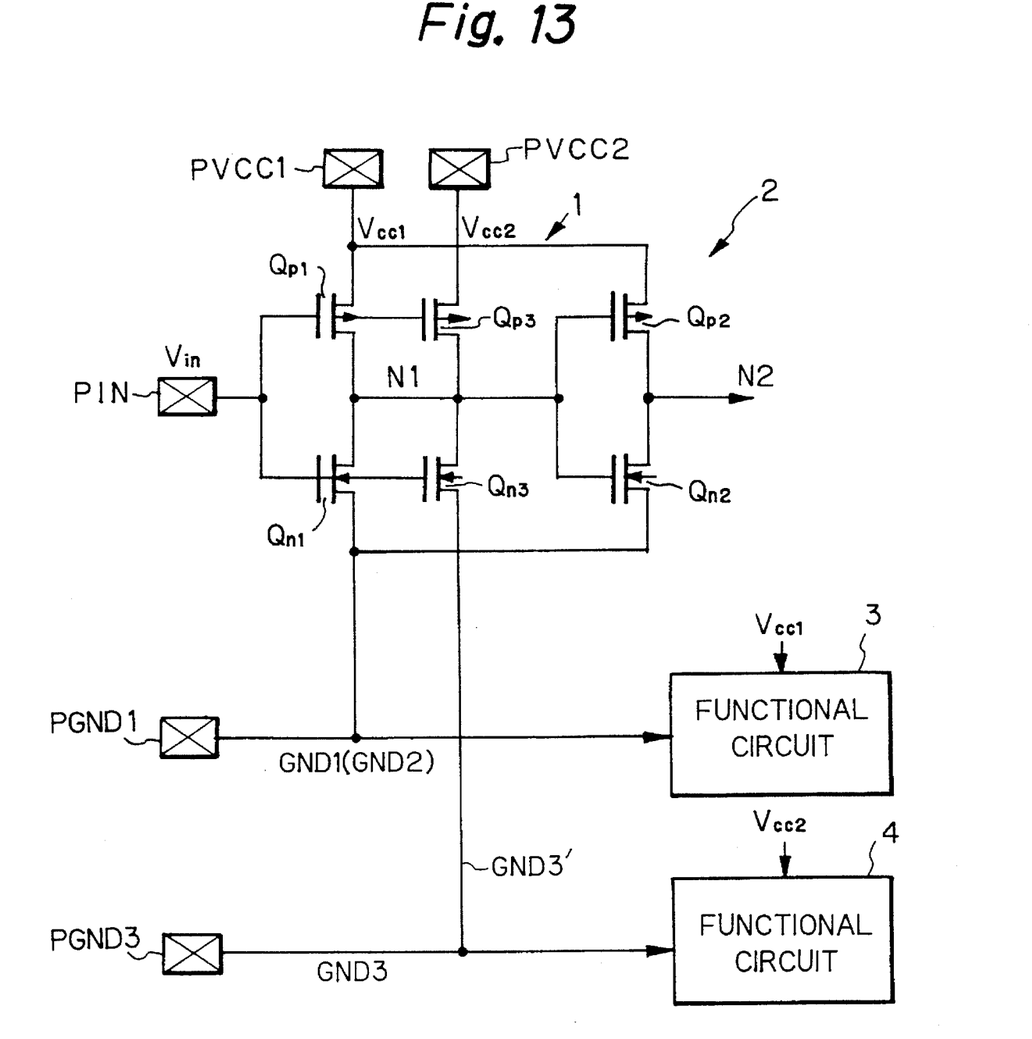
FIG. 13 is a circuit diagram illustrating a third embodiment of the semiconductor device according to the present invention.

In FIG. 13, which illustrates a third embodiment of the present invention, the first embodiment as illustrated in FIG. 7 is combined with the second embodiment as illustrated in FIG. 11. That is, the P-channel MOS transistor $Q_p^3$ associated with the power supply pad PVCC2 and the N-Channel MOS transistor $Q_n^3$ are added to the elements of FIG. 3. In other words, as illustrated in FIG. 14, the second aluminum layers GND3' and VCC' as well as the second aluminum layer $C_{cc}^2$ are added to the elements of FIG. 4.

Thus, in the third embodiment, the change of the input voltage $V_{in}$ by the noise due to the operation of the functional circuit 3 or 4 is reduced as compared with the device of FIG. 3. As a result, a transition of the voltage at the node N2 from a low level to a high level or vice versa is not delayed. Therefore, the access speed of the input circuit 1 is not so reduced, and accordingly, the access speed of the device is increased.

Figure 14:
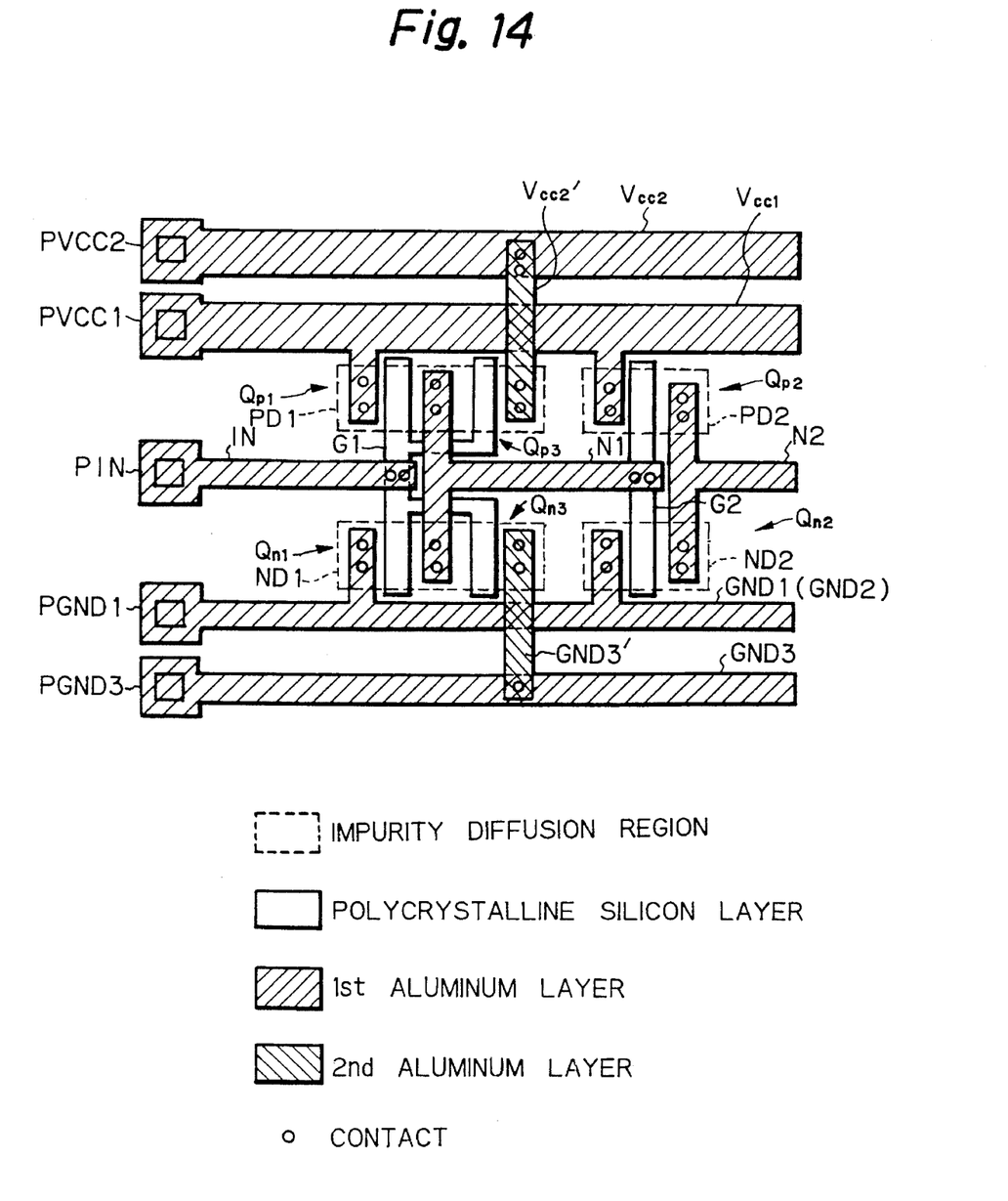
FIG. 14 is a plan view illustrating the device of FIG. 13.

In FIGS. 8, 12 and 14, although the connections IN, N1 and N2 are made of the first aluminum layers, the connections IN, N1 and N2 can be made of the second aluminum layers.

As explained hereinbefore, according to the present invention, since noise applied to an input circuit due to the operation of functional circuits is substantially reduced, the access speed of the input circuit can be increased, and accordingly, the access speed of the device can be increased.

I claim:

1. A semiconductor device comprising:

a first pad for receiving a first power supply voltage;

a second pad for receiving a second power supply voltage;

a third pad for receiving a third power supply voltage;

an input pad for receiving an input voltage;

an output node;

a first MIS transistor of a first conductivity type, being connected between said first pad and said output node and having a gate connected to said input pad;

a second MIS transistor of a second conductivity type opposite to said first conductivity type, being connected between said output node and said second pad and having a gate connected to said input pad; and a third MIS transistor of said second conductivity type, being connected between said output node and said third pad and having a gate connected to said input pad.

2. A device as set forth in claim 1, further comprising:

a first functional circuit connected between said first pad and said second pad; and a second functional circuit connected between said first pad and said third pad.

3. A device as set forth in claim 1, wherein said first MIS transistor is of a P-channel type, and said second and third MIS transistors are of an N-channel type.

4. A device as set forth in claim 1, wherein said first MIS transistor is of an N-channel type, and said second and third MIS transistors are of a P-channel type.

5. A semiconductor device comprising:

a first pad for receiving a first power supply voltage:

a second pad for receiving a second power supply voltage;

a third pad for receiving a third power supply voltage;

a fourth pad for receiving a fourth power supply voltage;

an input pad for receiving an input voltage;

an output node;

a first MIS transistor of a first conductivity type, being connected between said first pad and said output node and having a gate connected to said input pad;

a second MIS transistor of said first conductivity type, being connected between said second pad and said output node and having a gate connected to said input pad;

a third MIS transistor of a second conductivity type opposite to said first conductivity type, being connected between output node and said third pad and having a gate connected to said input pad; and a fourth MIS transistor of said second conductivity type, being connected between said output node and said fourth pad.

6. A device as set forth in claim 5, further comprising:

a first functional circuit connected between said first pad and said third pad; and a second functional circuit connected between said second pad and said fourth pad.

7. A device as set forth in claim 5, wherein said first and second MIS transistor are of a P-channel type, and said third and fourth MIS transistors are of an N-channel type.

8. A device as set forth in claim 5, wherein said first and second MIS transistors are of an N-channel type, and said third and fourth MIS transistors are of a P-channel type.

* * * * *

UNITED STATES PATENT AND TRADEMARK OFFICE
CERTIFICATE OF CORRECTION

PATENT NO. : 5,537,058
DATED : July 16, 1996
INVENTOR(S) : Souichirou YOSHIDA

It is certified that error(s) appears in the above-identified patent and that said Letters Patent is hereby corrected as shown below:

Column 2, line 39, delete "factional" and insert --functional--.

Column 3, line 44, delete "$V_{cc}$" and "(2", and insert --$V_{cc1}$-- and --)$^2$--.

Column 3, line 48, delete "I" and insert -- $I_n$ --.

Column 3, line 50, delete "$Q^1$" and insert --$Q_n 1$--.

Column 3, line 51, delete ")2" and insert -- )$^2$ --.

Column 4, line 1, delete "$_{\Delta vin}$" and insert -- $\Delta V_{in}$ --.

Column 4, line 4, delete ")2" and insert -- )$^2$ --.

Column 4, line 9, delete "$Q_n$" and insert --$Q_n 1$--.

Column 4, line 13, delete "s".

Column 4, line 27, delete "$V_{in\ 1}$" and insert -- $V_{in}$ --.

Column 4, line 42, delete "GNU)2" an insert -- GND2 --.

Column 4, line 57, delete ")2" and insert -- )$^2$ --.

UNITED STATES PATENT AND TRADEMARK OFFICE
CERTIFICATE OF CORRECTION

PATENT NO.    : 5,537,058
DATED         : July 16, 1996
INVENTOR(S)   : Souichirou YOSHIDA It is certified that error(s) appears in the above-identified patent and that said Letters Patent is hereby corrected as shown below:

Column 4, line 61, delete "$I_{n1}$" and insert -- $I_n1$ --.

Column 4, line 64, "$I_{n1} = K_n' (V_{in} - V_{thn1})2$" and insert -- $I_n1 = K_n' (V_{in} - V_{thn}1)^2$ --.

Column 5, line 9, delete "$I_p = I_{n1} + I_{n2}$" and insert -- $I_p = I_n^1 + I_n^2$ --.

Column 5, line 26, delete "$V_{cc1}$" and "$)2$" and insert -- $V_{cc}1$ -- and -- $)^2$ --, respectively Column 5, line 32, delete "$I_{n1}'$" and "$V_{thn1})2$" and insert -- $I_n1'$ -- and -- $V_{thn}1)^2$ --, respectively.

Column 5, line 38, delete "$I_{n2}'$" and "$V_{thn2})2$" and insert -- $I_n2'$ -- and -- $V_{thn}2)^2$ --, respectively.

Column 5, line 45, delete "$In_1' + I_{n2}'$" and insert -- $I_n1' + I_n2'$ --.

Column 5, line 48, delete "$(I_{n1} + I_{n2})/(I_{n1}' + I_{n2}')$" and insert -- $(I_n1 + I_n2)/(I_n1' + I_n2')$ --.

Column 5, line 51, delete 32 and insert -- = --.

Column 6, line 27, delete "VCC'" and insert -- VCC2' --.

Signed and Sealed this

Fourteenth Day of January, 1997

*Attest:*

BRUCE LEHMAN

*Attesting Officer*    Commissioner of Patents and Trademarks